(12) United States Patent
Chang et al.

(10) Patent No.: US 6,518,183 B1
(45) Date of Patent: Feb. 11, 2003

(54) HILLOCK INHIBITING METHOD FOR FORMING A PASSIVATED COPPER CONTAINING CONDUCTOR LAYER

(75) Inventors: Weng Chang, Taipei (TW); Tien-I Bao, Hsin-Chu (TW); Ying-Ho Chen, Taipei (TW); Syun-Ming Jang, Hsin-Chu (TW)

(73) Assignee: Taiwan Semiconductor Manufacturing Co., Ltd., Hsin Chu (TW)

(*) Notice: Subject to any disclaimer, the term of this patent is extended or adjusted under 35 U.S.C. 154(b) by 0 days.

(21) Appl. No.: 09/947,782

(22) Filed: Sep. 6, 2001

(51) Int. Cl.$^7$ .......................... H01L 21/44; H01L 21/26
(52) U.S. Cl. ...................... 438/687; 438/657; 438/660; 438/663; 438/798
(58) Field of Search .................... 438/687, 637–640, 438/660, 663, 798

(56) References Cited

U.S. PATENT DOCUMENTS

| | | | |
|---|---|---|---|
| 5,939,788 A | | 8/1999 | McTeer ...................... 257/751 |
| 6,033,584 A | * | 3/2000 | Ngo et al. |
| 6,043,153 A | | 3/2000 | Nogami et al. ............. 438/687 |
| 6,090,701 A | * | 7/2000 | Hasunuma et al. |
| 6,136,680 A | * | 10/2000 | Lai et al. |
| 6,184,143 B1 | * | 2/2001 | Ohashi et al. |
| 6,333,248 B1 | * | 12/2001 | Kishimoto |

\* cited by examiner

*Primary Examiner*—Ha Tran Nguyen
(74) *Attorney, Agent, or Firm*—Tung & Associates (57) ABSTRACT

Within a method for fabricating a microelectronic fabrication having formed therein a copper containing conductor layer passivated with a passivation layer, there is first: (1) pre-heated the copper containing conductor layer to a temperature of from about 300 to about 450 degrees centigrade for a time period of from about 30 to about 120 seconds to form a pre-heated copper containing conductor layer; and then (2) plasma treated the pre-heated copper containing conductor layer within a reducing plasma to form a plasma treated pre-heated copper containing conductor layer; prior to (3)forming upon the plasma treated pre-heated copper containing conductor layer the passivation layer. The foregoing process sequence provides for attenuated hillock defects within the plasma treated pre-heated copper containing conductor layer when forming the passivation layer thereupon.

15 Claims, 3 Drawing Sheets

HILLOCK INHIBITING METHOD FOR FORMING A PASSIVATED COPPER CONTAINING CONDUCTOR LAYER

BACKGROUND OF THE INVENTION

1. Field of the Invention

The present invention relates generally to methods for forming copper containing conductor layers within microelectronic fabrications. More particularly, the present invention relates to methods for forming passivated copper containing conductor layers within microelectronic fabrications.

2. Description of the Related Art

Microelectronic fabrications are formed from microelectronic substrates over which are formed patterned conductor layers which are separated by dielectric layers.

As microelectronic fabrication integration levels have increased and patterned conductor layer dimensions have decreased, it has become increasingly common within the art of microelectronic fabrication to employ when fabricating patterned conductor layers within microelectronic fabrications copper containing conductor materials, in place of more conventional aluminum containing conductor materials.

Copper containing conductor materials are desirable in the art of microelectronic fabrication for forming patterned conductor layers within microelectronic fabrications, in place of more conventional aluminum containing conductor materials for forming patterned conductor layers within microelectronic fabrications, insofar as patterned conductor layers formed of copper containing conductor materials are generally less susceptible to detrimental effects, such as but not limited to detrimental electromigration effects.

While patterned conductor layers formed of copper containing conductor materials are thus clearly desirable in the art of microelectronic fabrication, patterned conductor layers formed of copper containing conductor materials are nonetheless not entirely without problems in the art of microelectronic fabrication. In that regard, it is known in the art of microelectronic fabrication that patterned conductor layers formed of copper containing conductor materials are often difficult to form within microelectronic fabrications with enhanced integrity, and in particular with enhanced physical integrity, such as but not limited to enhanced dimensional integrity.

It is thus desirable in the art of microelectronic fabrication to provide methods for forming within microelectronic fabrications, with enhanced integrity, patterned conductor layers formed of copper containing conductor materials.

It is towards the foregoing object that the present invention is more specifically directed.

Various methods have been disclosed in the art of microelectronic fabrication for forming, with desirable properties, patterned conductor layers formed of copper containing conductor materials.

Included among the methods, but not limited among the methods, are methods disclosed within: (1) McTeer, in U.S. Pat. No. 5,939,788, (a pair of methods for forming, with enhanced manufacturing efficiency, patterned copper containing conductor layers within apertures within microelectronic substrates by employing: (a) a titanium aluminum nitride layer as a thermally stable barrier layer; or (b) an aluminum liner layer as an adhesion promoter layer interposed between a patterned copper containing conductor layer and an otherwise conventional barrier layer); (2) Nogami et al., in U.S. Pat. No. 6,043,153 (a method for forming, with enhanced electromigration resistance, a patterned copper containing conductor layer within an aperture within a substrate employed within a microelectronic fabrication by thermally annealing the patterned copper containing conductor layer formed within the aperture prior to forming thereupon a passivating layer); and (3) Ohashi et al., in U.S. Pat. No. 6,184,143 (a method for forming, with enhanced reliability, a microelectronic fabrication having formed therein a dished chemical mechanical polish (CMP) planarized patterned copper containing conductor layer by planarizing the dished chemical mechanical polish (CMP) planarized patterned copper containing conductor layer with a spin-on planarizing material).

Desirable in the art of microelectronic fabrication are additional methods which may be employed for forming within microelectronic fabrications, with enhanced integrity, patterned conductor layers formed of copper containing conductor materials.

It is towards the foregoing object that the present invention is more specifically directed.

SUMMARY OF THE INVENTION

A first object of the present invention is to provide a method for forming within a microelectronic fabrication a patterned copper containing conductor layer.

A second object of the present invention is to provide a method in accord with the first object of the present invention, wherein the patterned copper containing conductor layer is formed with enhanced integrity.

A third object of the present invention is to provide a method in accord with the first object of the present invention and the second object of the present invention, wherein the method is readily commercially implemented.

In accord with the objects of the present invention, there is provided by the present invention a method for fabricating a microelectronic fabrication. To practice the method of the present invention, there is first provided a substrate. There is then formed over the substrate a copper containing conductor layer. Finally, there is then formed upon the copper containing conductor layer a passivation layer. Within the present invention, the passivation layer is formed by sequentially. (1) pre-heating the copper containing conductor layer to a temperature of from about 300 to about 450 degrees centigrade for a time period of from about 30 to about 120 seconds to form a pre-heated copper containing conductor layer; (2) plasma treating the pre-heated copper containing conductor layer within a reducing plasma to form a plasma treated preheated copper containing conductor layer; and (3) forming upon the plasma treated pre-heated copper containing conductor layer the passivation layer.

Within the present invention, by pre-heating the copper containing conductor layer to form the pre-heated copper containing conductor layer and then plasma treating the pre-heated copper containing conductor layer to form the plasma treated pre-heated copper containing conductor layer, there is attenuated hillock defects within the plasma treated pre-heated copper containing conductor layer when forming the passivation layer thereupon. Thus, in accord with the objects of the present invention there is provided by the present invention a method for forming a copper containing conductor layer with enhanced integrity.

The method of the present invention is readily commercially implemented.

The present invention employs methods and materials as are otherwise generally known in the art of microelectronic fabrication, but employed within the context of a specific process ordering and a specific series of process limitations to provide the present invention. Since it is thus at least in part a specific process ordering and a specific series of process limitations which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming within a microelectronic fabrication a copper containing conductor layer, wherein the copper containing conductor layer is formed with enhanced integrity.

The present invention realizes the foregoing object by employing a sequential two step pre-heating and plasma treating of a copper containing conductor layer prior to forming thereupon a passivating layer.

Although the preferred embodiment of the present invention provides particular value within the context of forming a patterned copper containing conductor layer which may be employed when fabricating a semiconductor integrated circuit microelectronic fabrication, the present invention may be employed for forming copper containing conductor layers which may be employed when fabricating microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Figure 1:
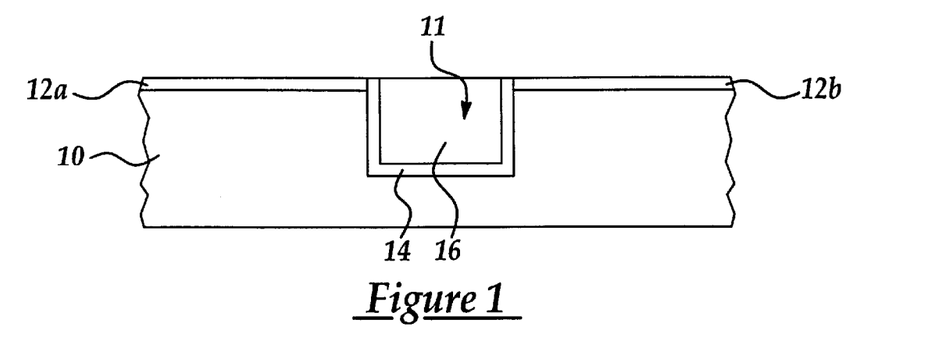
FIG. 1 and FIG. 2 show a pair of schematic cross-sectional diagrams illustrating the results of progressive stages of forming within a microelectronic fabrication a patterned copper containing conductor layer not in accord with the present invention.
Figure 2:
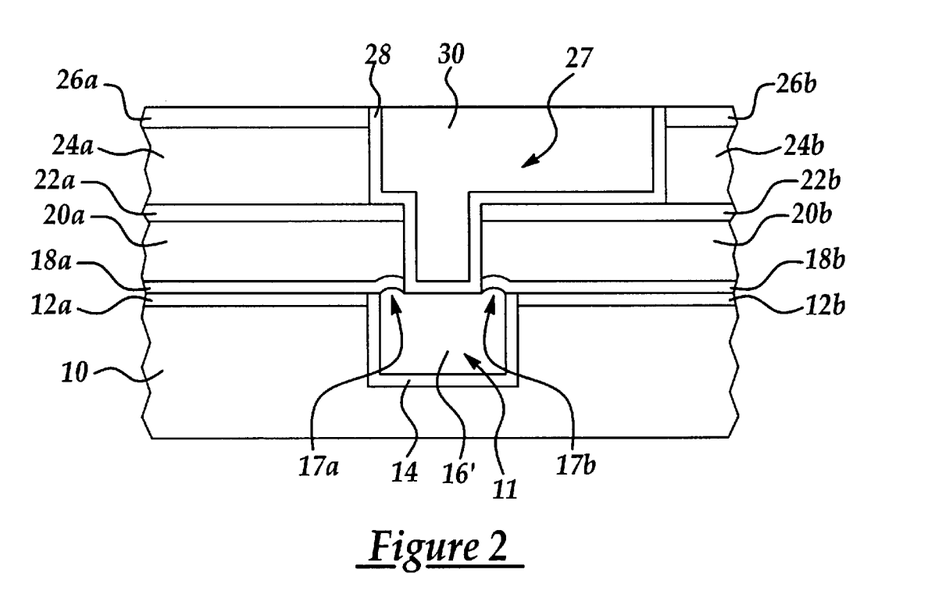

Referring now to FIG. 1 and FIG. 2, there is shown a pair of schematic cross-sectional diagrams illustrating the results of progressive stages of forming within a microelectronic fabrication a patterned copper containing conductor layer not in accord with the present invention.

Shown in FIG. 1 is a schematic cress-sectional diagram of the microelectronic fabrication at an early stage in its fabrication not in accord with the present invention.

Shown in FIG. 1, in a first instance, is a substrate 10 having formed therein an aperture 11 which is defined in part by a pair of patterned first polish stop layers 12a and 12b which is formed upon a surface of the substrate 10. As is further illustrated within the schematic cross-sectional diagram of FIG. 1, the aperture 11 in turn has formed therein a patterned conformal first barrier layer 14 which in turn has formed thereupon a patterned copper containing conductor layer 16.

As is understood by a person skilled in the art, the microelectronic fabrication whose schematic cross-sectional diagram is illustrated in FIG. 1 is typically and preferably formed employing a chemical mechanical polish (CMP) planarizing method which provides a chemical mechanical polish (CMP) planarizing of a blanket copper containing conductor layer formed upon a blanket conformal barrier layer, both of which are formed over the substrate 10 and the pair of patterned first polish stop layers 12a and 12b, and filling the aperture 11, and further wherein the pair of patterned first polish stop layers 12a and 12b serves as a pair of polish stop layers within the chemical mechanical polish (CMP) planarizing method.

Referring now to FIG. 2, there is shown a schematic cross-sectional diagram illustrating the results of further processing of the microelectronic fabrication whose schematic cross-sectional diagram is illustrated in FIG. 1.

Shown in FIG. 2 is a schematic cross-sectional diagram of a microelectronic fabrication otherwise equivalent to the microelectronic fabrication whose schematic cross-sectional diagram is illustrated in FIG. 1, but wherein there is formed over the pair of patterned polish stop layers 12a and 12b, the patterned conformal first barrier layer 14 and the patterned copper containing conductor layer 16 an additional series of pairs of patterned layers comprising: (1) a pair of patterned second passivation barrier layers 18a and 18b, having formed thereupon; (2) a pair of patterned first inter-metal dielectric (IMD) layers 20a and 20b, in turn having formed thereupon; (3) a pair of patterned etch stop layers 22a and 22b, in turn having formed thereupon; (4) a pair of patterned second inter-metal dielectric (IMD) layers 24a and 24b, finally in turn having formed thereupon; (4) a pair of patterned second polish stop layers 26a and 26b.

As is understood by a person skilled in the art, each of the foregoing pairs of patterned layers within the additional series of pairs of patterned layers may be formed employing methods and materials as are otherwise generally conventional in the art of microelectronic fabrication. Typically and preferably the pair of patterned first inter-metal dielectric (IMD) layers 20a and 20b, as well as the pair of patterned second inter-metal dielectric (IMD) layers 24a and 24b, are formed of a single dielectric material. Similarly, typically and preferably, the pair of patterned second passivation barrier layers 18a and 18b is formed of a passivation barrier material intended to inhibit interdiffusion of the patterned copper containing conductor layer 16 with the pair of patterned first inter-metal dielectric (IMD) layers 20a and 20b. Finally, the pair of patterned etch stop layers 22a and 22b and the pair of patterned second polish stop layers 26a and 26b are positioned and sized such that there is formed accessing a portion of the patterned copper containing conductor layer 16 a dual damascene aperture 27 (i.e., a trench of areal dimension greater than, completely overlapping and contiguous with a via which accesses the patterned copper containing conductor layer 16) as illustrated within the schematic cross-sectional diagram of FIG. 2.

Finally, there is also shown within the schematic cross-sectional diagram of FIG. 2, and filling the dual damascene aperture 27 a patterned conformal third barrier layer 28 having formed thereupon a contiguous patterned conductor interconnect and patterned conductor stud layer 30, both of which are typically and preferably formed employing a chemical mechanical polish (CMP) planarizing method analogous or equivalent to the chemical mechanical polish (CMP) planarizing method as is preferably employed for forming the patterned conformal first barrier layer 14 having formed thereupon the patterned copper containing conductor layer 16 as is illustrated in FIG. 1.

As is illustrated within the schematic cross-sectional diagram of FIG. 2, and incident to forming the series of pairs of patterned layers upon the microelectronic fabrication whose schematic cross-sectional diagram is illustrated in FIG. 1 to provide the microelectronic fabrication whose schematic cross-sectional diagram is illustrated in FIG. 2, there is often formed within the patterned copper containing conductor layer 16 as illustrated within the schematic cross-sectional diagram of FIG. 1 at least one hillock, and more typically at least a pair of hillocks 17a and 17b as illustrated within the schematic cross-sectional diagram of FIG. 2, to provide a deformed patterned copper containing conductor layer 16' as is illustrated within the schematic cross-sectional diagram of FIG. 2. Such a deformed patterned copper containing conductor layer 16' as is illustrated within the schematic cross-sectional diagram of FIG. 2 is undesirable in the art of microelectronic fabrication insofar as it provides for thinning of the pair of patterned second passivation barrier layers 18a and 18b, such that there may eventually result interdiffusion of a copper containing conductor material from which is formed the deformed patterned copper containing conductor layer 16' with a dielectric material from which is formed the pair of patterned first inter-metal dielectric (IMD) layers 20a and 20b, thus in turn providing for compromised integrity of the microelectronic fabrication whose schematic cross-sectional diagram is illustrated in FIG. 2.

It is thus towards avoidance of defects, such as the pair of hillocks 17a and 17b within the deformed patterned copper containing conductor layer 16' within the aperture 11 within the substrate 10 within the microelectronic fabrication whose schematic cross-sectional diagram is illustrated in FIG. 2, that the present invention is directed, such as to provide within the microelectronic fabrication whose schematic cross-sectional diagram is illustrated in FIG. 2 a patterned copper containing conductor layer with enhanced integrity.

Referring now to FIG. 3 to FIG. 8, there is shown a series of schematic cross-sectional diagrams illustrating the results of progressive stages of forming within a microelectronic fabrication a patterned copper containing conductor layer in accord with the present invention.

Figure 3:
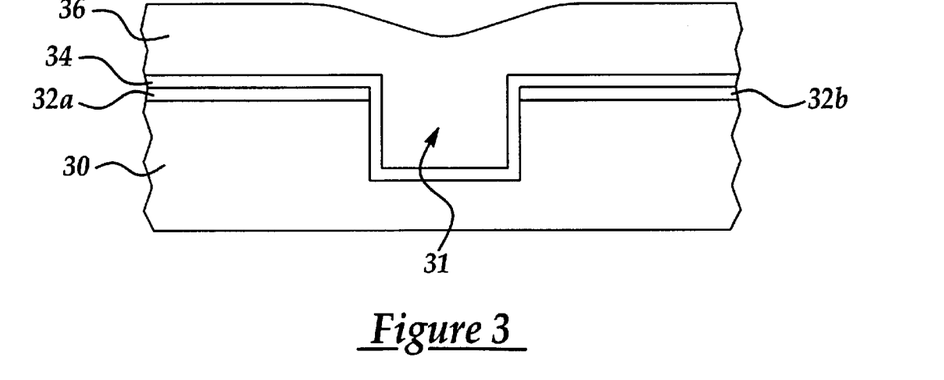
FIG. 3, FIG. 4, FIG. 5, FIG. 6, FIG. 7 and FIG. 8 show a series of schematic cross-sectional diagrams illustrating the results of progressive stages of forming within a microelectronic fabrication a patterned copper containing conductor layer in accord with the present invention.

Shown in FIG. 3 is a schematic cross-sectional diagram of the microelectronic fabrication at an early stage in its fabrication in accord with the preferred embodiment of the present invention.

Shown in FIG. 3 is a substrate 30 having formed therein an aperture 31 defined in part by a pair of patterned first polish stop layers 32a and 32b formed upon the substrate 30 and adjoining the aperture 31, wherein the substrate 30, the aperture 31 and the pair of patterned first polish stop layers 32a and 32b correspond generally with the substrate 10, the aperture 11 and the pair of patterned first polish stop layers 12a and 12b as illustrated within the schematic cross-sectional diagram of FIG. 1.

Within the preferred embodiment of the present invention with respect to the substrate 30, the substrate 30 may be employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Although not specifically illustrated within the schematic cross-sectional diagram of FIG. 3, the substrate 30 may consist of a substrate alone as employed within a microelectronic fabrication, or in an alternative, the substrate 30 may comprise a substrate as employed within a microelectronic fabrication, where the substrate has formed thereupon and/or thereover any of several additional microelectronic layers as are conventionally employed within the microelectronic fabrication within which is employed the substrate. Analogously with the substrate alone as employed within the microelectronic fabrication, the additional microelectronic layers may be formed from microelectronic materials selected from the group including but not limited to microelectronic conductor materials, microelectronic semiconductor materials and microelectronic dielectric materials.

Similarly, and although also not specifically illustrated within the schematic cross-sectional diagram of FIG. 3, the substrate 30, typically and preferably, but not exclusively, when the substrate 30 consists of or comprises a semiconductor substrate employed within a semiconductor integrated circuit microelectronic fabrication, has formed therein and/or thereupon microelectronic devices as are conventional within the microelectronic fabrication within which is employed the substrate 30. Such microelectronic devices may include, but are not limited to resistors, transistors, diodes and capacitors.

Within the preferred embodiment of the present invention with respect to the aperture 31, the aperture 31 typically and preferably has an aperture depth within the substrate 30 of from about 2000 to about 10000 angstroms and a bidirectional (i.e., areal) aperture width within the substrate 30 of from about 0.14 to about 100 microns.

Within the preferred embodiment of the present invention with respect to the pair of patterned polish stop layers 32a and 32b, the pair of patterned polish stop layers 32a and 32b will typically and preferably be formed of a dense polish stop material, such as but not limited to a dense silicon nitride polish stop material, typically and preferably formed to a thickness of from about 200 to about 800 angstroms upon the substrate 30 and defining in part the aperture 31.

Within the preferred embodiment of the present invention with respect to the blanket conformal first barrier layer 34, the blanket conformal first barrier layer 34 may be formed of any of several barrier materials as may be employed for forming the patterned conformal first barrier layer 14 as illustrated within the schematic cross-sectional diagram of FIG. 1, including but not limited to dielectric barrier materials and conductor barrier materials, but preferably conductor barrier materials, such as but not limited to tantalum, titanium, tantalum nitride and titanium nitride barrier materials, or other barrier materials as are more specifically disclosed within the Related Art references as disclosed within the Description of the Related Art. Typically and preferably, the blanket conformal first barrier layer 34 is formed to a thickness of from about 20 to about 500 angstroms.

Finally, within the preferred embodiment of the present invention with respect to the blanket copper containing conductor layer 36, the blanket copper containing conductor layer 36 may be formed of copper containing conductor materials as are known in the art of microelectronic fabrication, including but not limited to copper and copper alloys of greater than about 99 weight percent copper and more typically and preferably greater than about 99.9 weight percent copper. Typically and preferably, the blanket copper containing conductor layer 36 is formed to a thickness of from about 2000 to about 20000 angstroms, typically and preferably, but not exclusively, while employing an electrochemical deposition method.

As is understood by a person skilled in the art, and also in accord with the Related Art disclosures within the Description of the Related Art, typically and preferably, the blanket copper containing conductor layer 36 as illustrated within the schematic cross-sectional diagram of FIG. 3 is subjected to a thermal annealing.

Figure 4:
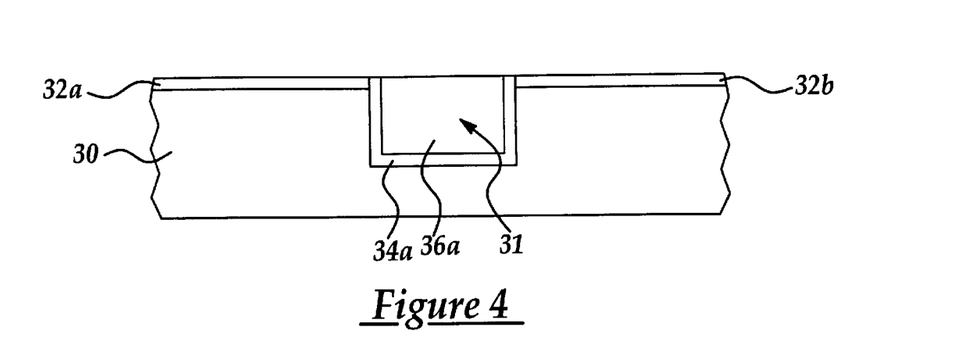

Referring now to FIG. 4, there is shown a schematic cross-sectional diagram illustrating the results of further processing of the microelectronic fabrication whose schematic cross-sectional diagram is illustrated in FIG. 3.

Shown in FIG. 4 is a schematic cross-sectional diagram of a microelectronic fabrication otherwise equivalent to the microelectronic fabrication whose schematic cross-sectional diagram is illustrated in FIG. 3, but wherein the blanket copper containing conductor layer 36 has been planarized to form from the blanket copper containing conductor layer 36 as illustrated within the schematic cross-sectional diagram of FIG. 3 a patterned copper containing conductor layer 36a in turn formed upon a patterned conformal first barrier layer 34a in turn formed within the aperture 31 formed within the substrate 30.

Within the preferred embodiment of the present invention with respect to the planarizing method which may be employed for forming from the blanket copper containing conductor layer 36 as illustrated within the schematic cross-sectional diagram of FIG. 3 the patterned copper containing conductor layer 36a as illustrated within the schematic cross-sectional diagram of FIG. 4, the planarizing method may include, but is not limited to, vacuum ion planarizing methods (such as but not limited to reactive ion etch (RIE) planarizing methods and physical ion etch sputtering planarizing methods), chemical planarizing methods, mechanical planarizing methods and more typically and preferably chemical mechanical polish (CMP) planarizing methods, which in turn may employ ancillary methods and materials as are otherwise conventional in the art of microelectronic fabrication, and as are appropriate for the copper containing conductor material from which is formed the blanket copper containing conductor layer 36.

Figure 5:
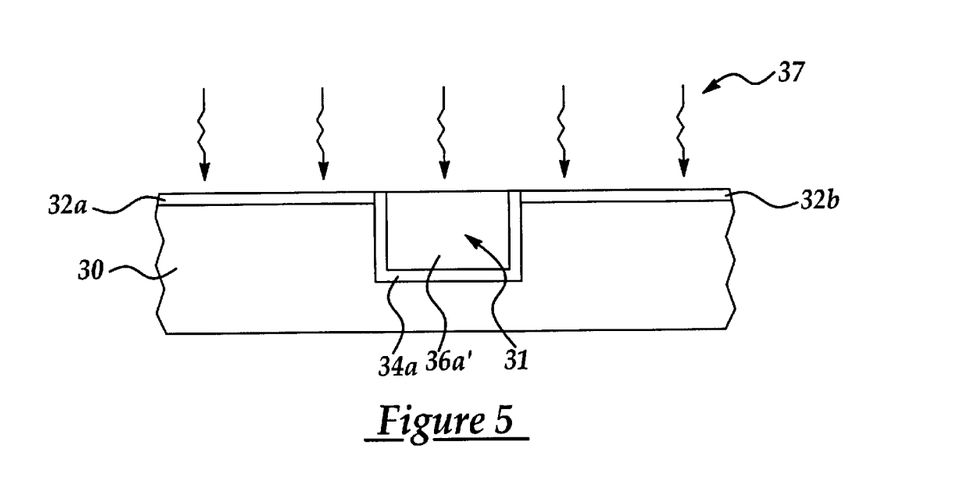

Referring now to FIG. 5, there is shown a schematic cross-sectional diagram illustrating the results of further processing of the microelectronic fabrication whose schematic cross-sectional diagram is illustrated in FIG. 4.

Shown in FIG. 5 is a schematic cross-sectional diagram of a microelectronic fabrication otherwise equivalent to the microelectronic fabrication whose schematic cross-sectional diagram is illustrated in FIG. 4, but wherein the substrate 30 having formed thereover the patterned copper containing conductor layer 36a has been pre-heated within a thermal annealing environment 37 to form from the patterned copper containing conductor layer 36a a pre-heated patterned copper containing conductor layer 36a'.

Within the preferred embodiment of the present invention, the thermal annealing environment 37 employs: (1) a temperature of from about 300 to about 450 degrees centigrade, and (2) a non-oxidizing or reducing ambient such as nitrogen, hydrogen, ammonia or methane. The thermal annealing environment 37 may be provided at atmospheric pressure, but is preferably provided at a pressure of from about 5 to about 50 torr.

Figure 6:
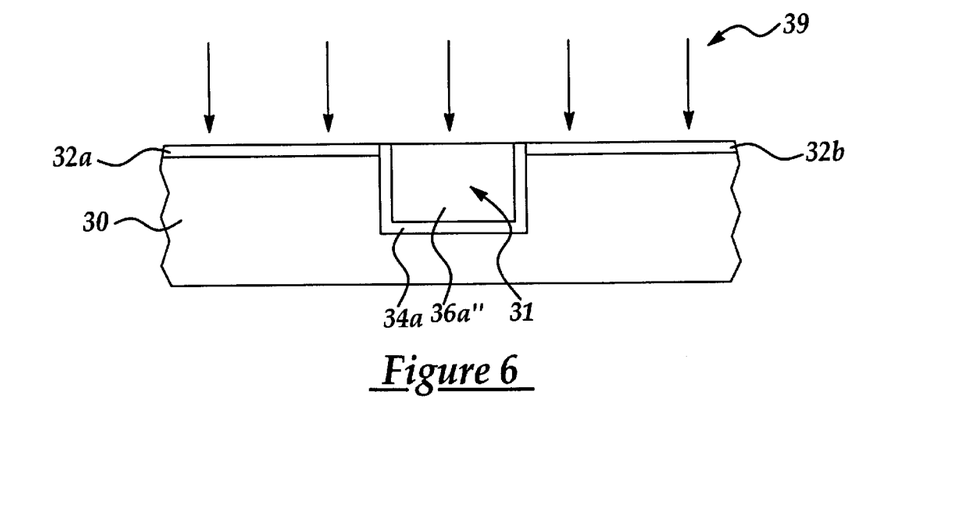

Referring now to FIG. 6, there is shown a schematic cross-sectional diagram illustrating the results of further processing of the microelectronic fabrication whose schematic cross-sectional diagram is illustrated in FIG. 5.

Shown in FIG. 6 is a schematic cross-sectional diagram of a microelectronic fabrication otherwise equivalent to the microelectronic fabrication whose schematic cross-sectional diagram is illustrated in FIG. 5, but wherein the substrate 30 having formed thereover the pre-heated patterned copper containing conductor layer 36a' has been treated within a reducing plasma 39 to form from the pre-heated copper containing conductor layer 36a' a plasma treated pre-heated patterned copper containing conductor layer 36a".

Within the preferred embodiment of the present invention, the reducing plasma 37 may employ a reducing gas composition as is conventional in the art of microelectronic fabrication, including but not limited to hydrogen, ammonia and methane reducing gas compositions.

Typically and preferably, the reducing plasma 39 also employs: (1) a reactor chamber pressure of from about 2 to about 20 torr; (2) a radio frequency source power of from about 200 to about 2000 watts per square centimeter substrate 30 area; and (3) a reducing gas flow rate of from about 500 to about 3000 standard cubic centimeters per minute (sccm). Typically and preferably, the reducing plasma 39 treatment of the pre-heated patterned copper containing conductor layer 36a' is provided for a time period of from about 0.5 to about 3 minutes when forming therefrom the plasma treated pre-heated patterned copper containing conductor layer 36a'.

Figure 7:
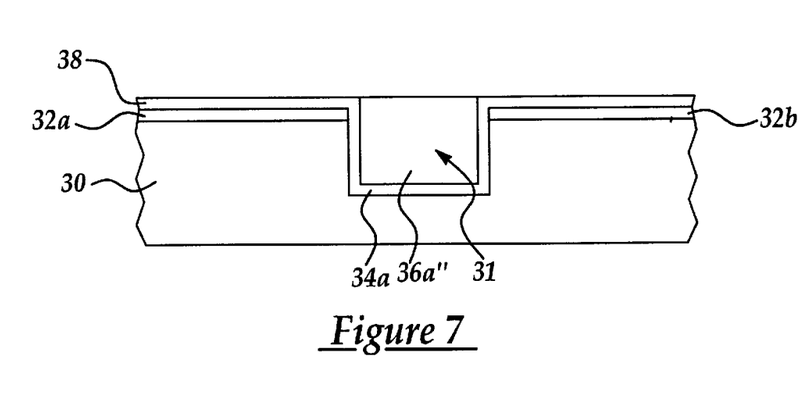

Referring now to FIG. 7, there is shown a schematic cross-sectional diagram illustrating the results of further processing of the microelectronic fabrication whose schematic cross-sectional diagram is illustrated in FIG. 6.

Shown in FIG. 7 is a schematic cross-sectional diagram of a microelectronic fabrication otherwise equivalent to the microelectronic fabrication whose schematic cross-sectional diagram is illustrated in FIG. 6, but wherein there is formed upon the plasma treated pre-heated patterned copper containing conductor layer 36a" and bridging to the pair of patterned first polish stop layers 32a and 32b a blanket passivation layer 38.

Within the preferred embodiment of the present invention, the blanket passivation layer 38 may be formed of passivation materials as are conventional in the art of microelectronic fabrication, including but not limited to silicon nitride passivation materials, silicon oxynitride passivation materials and silicon carbide passivation materials. Typically and preferably, the blanket passivation layer 38 is formed to a thickness of from about 200 to about 800 angstroms while employing a chemical vapor deposition (CVD) method or a plasma enhanced chemical vapor deposition (PECVD) method.

As is understood by a person skilled in the art, and in accord with the examples which follow, by sequentially pre-heating and plasma treating the patterned copper containing conductor layer 36a as illustrated within the schematic cross-sectional diagram of FIG. 4 to form therefrom the plasma treated pre-heated patterned copper containing conductor layer 36a" as illustrated within the schematic cross-sectional diagram of FIG. 6, the blanket passivation layer 38 when formed upon the plasma treated pre-heated patterned copper containing conductor layer 36a" is formed with attenuated hillock defects.

As is further understood by a person skilled in the art, such sequential pre-heating and plasma treating is undertaken otherwise absent any thermal annealing subsequent to chemical mechanical polish (CMP) planarizing the blanket copper containing conductor layer 36 to form the patterned copper containing conductor layer 36a.

As is further understood by a person skilled in the art, while the schematic cross-sectional diagrams of FIG. 5 to FIG. 7 illustrate the present invention within the context of ostensibly independent pre-heating, plasma treating and passivation layer formation process steps, the present invention intends that the pre-heating and plasma treating of the patterned copper containing conductor layer 36a as illustrated within the schematic cross-sectional diagram of FIG. 4 incident to providing the plasma treated pre-heated patterned copper containing conductor layer having formed thereupon the blanket passivation layer 38 as illustrated within the schematic cross-sectional diagram of FIG. 7 are preferably integrated into a sequential process flow within a single reactor chamber. In that regard, it is particularly desirable within the context of the present invention for a pre-heating to be undertaken within a reducing atmosphere employed within a reducing plasma, and the reducing plasma employ a reducing atmosphere in part employed for forming the blanket passivation layer 38.

Figure 8:
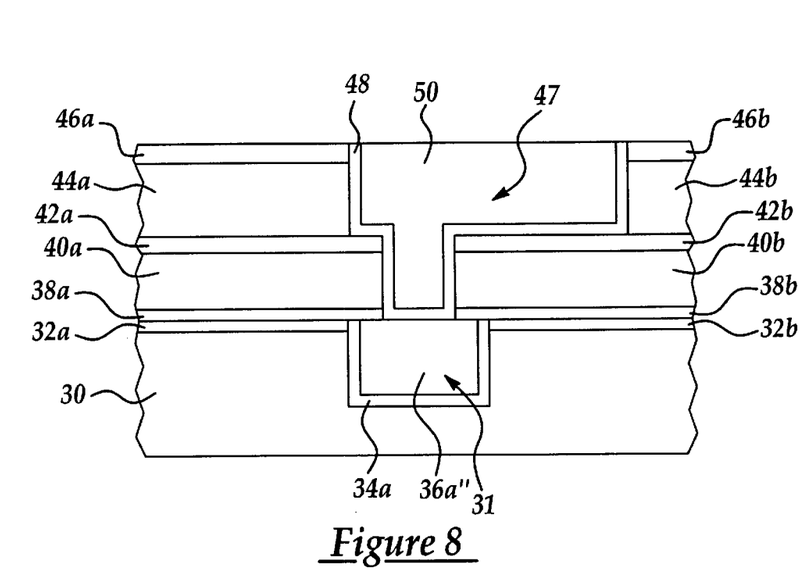

Referring now to FIG. 8, there is shown a schematic cross-sectional diagram illustrating the results of further processing of the microelectronic fabrication whose schematic cross-sectional diagram is illustrated in FIG. 7.

Shown in FIG. 8 is a schematic cross-sectional diagram of a microelectronic fabrication otherwise equivalent to the microelectronic fabrication whose schematic cross-sectional diagram is illustrated in FIG. 7, but wherein there is formed upon the pair of patterned first etch stop layers 32a and 32b, the patterned conformal first barrier layer 34a and the plasma treated pre-heated patterned copper containing conductor layer 36a": (1) a pair of patterned passivation layers 38a and 38b (formed from the blanket passivation layer 38), having formed thereupon; (2) a pair of patterned first inter-metal dielectric (IMD) layers 40a and 40b, in turn having formed thereupon; (3) an optional pair of patterned etch stop layers 42a and 42b, in turn having formed thereupon; (4) a pair of patterned second inter-metal dielectric (IMD) layers 44a and 44b, finally in turn having formed thereupon; (5) an optional pair of patterned polish stop layers 46a and 46b, wherein the foregoing series of pairs of patterned layers define, as is illustrated within the schematic cross-sectional diagram of FIG. 7, a dual damascene aperture 47 comprising a trench larger than, completely overlapping and contiguous with a via accessing the plasma treated pre-heated patterned copper containing conductor layer 36a".

As is understood by a person skilled in the art, each of the foregoing pairs of patterned layers which comprise the dual damascene aperture 47 is formed from a corresponding series of blanket layers which are photolithographically masked and etched to provide the dual damascene aperture 47. As is understood by a person skilled in the art, when forming the dual damascene aperture 47, either the trench or the via may be formed first.

As is further understood by a person skilled in the art, various of the foregoing pairs of layers are formed employing methods, materials and thickness dimensions as are conventional in the art of microelectronic fabrication, and will typically include methods which provide deposition temperatures in a range generally greater than about 300 degrees centigrade and more specifically in a range of about 350 to about 450 degrees centigrade, at which deposition temperature the patterned copper containing conductor layer 36a as illustrated within the schematic cross-sectional diagram of FIG. 4 would otherwise have generated hillock defects (in accord with the schematic cross-sectional diagram of FIG. 2) were it no pre-heated and plasma treated in accord with the present invention.

Finally, there is also illustrated within the schematic cross-sectional diagram of FIG. 7, and formed into the dual damascene aperture 47, a patterned conformal third barrier layer 48 having formed thereupon a contiguous patterned conductor interconnect and patterned conductor stud layer 50.

Within the preferred embodiment of the present invention, the patterned conformal third barrier layer 48 and the contiguous patterned conductor interconnect and patterned conductor stud layer 50 are formed employing planarizing methods and materials analogous or equivalent to the planarizing methods and materials employed for forming the patterned conformal first barrier layer 34a and the patterned copper containing conductor layer 36a as also illustrated within the schematic cross-sectional diagram of FIG. 4.

Upon forming the microelectronic fabrication whose schematic cross-sectional diagram is illustrated in FIG. 8, there is formed a microelectronic fabrication having formed therein a patterned copper containing conductor layer with enhanced integrity, and in particular with enhanced physical integrity, such as but not limited to enhanced dimensional integrity. The present invention realizes the foregoing object by employing when forming upon the patterned copper containing conductor layer a blanket passivation layer a sequential pre-heating and plasma treating of the patterned copper containing conductor layer.

EXAMPLES

In order illustrate the value of the present invention, there was provided a series of microelectronic fabrications generally in accord with the schematic cross-sectional diagram of FIG. 4.

The series of microelectronic fabrications comprised a series of semiconductor substrates having formed thereover a series of patterned silicon oxide dielectric layers defining a series of apertures of depth about 3000 to about 4000 angstroms and areal linewidth about 0.16 by about 0.22 microns. Formed into the series of apertures was a series of patterned titanium nitride barrier layers having formed thereupon a series of patterned copper containing conductor layers, both formed via a chemical mechanical polish (CMP) planarizing of a series of blanket titanium nitride barrier layers having formed thereupon a series of blanket copper containing conductor layers. Each of the blanket copper containing conductor layers was formed to a thickness of about 8000 angstroms and thermally annealed at a temperature of either 150 degrees centigrade to about 250 degrees centigrade; or 250 degrees centigrade to about 350 degrees centigrade within a forming gas atmosphere.

After forming the patterned barrier layers and the patterned copper containing conductor layers, various sub-groups of the substrates were either: (1) not thermally annealed; (2) thermally annealed at a temperature of about 150 degrees centigrade to about 250 degrees centigrade; or (3) thermally annealed at a temperature of about 250 degrees centigrade to about 350 degrees centigrade. For the later two options, the thermal annealing was provided in a forming gas atmosphere.

Finally, there was formed upon each of the patterned copper containing conductor layers a silicon nitride passivation layer employing either of two deposition sequences.

The first deposition sequence employed an ammonia plasma treatment of a patterned copper containing conductor layer at: (1) a treactor chamber pressure of about 2 to about 20 torr; (2) a radio frequency power of about 200 to about 2000 watts per square centimeter substrate area; (3) a substrate temperature of about 350 degrees centigrade to about 450 degrees centigrade; and (4) an ammonia flow rate of about 500 to about 3000 standard cubic centimeters per minute (sccm), for a time period of about 0.5 to about 3 minutes. The ammonia plasma treatment was followed by a thermal pre-heating of the ammonia plasma treated patterned copper containing conductor layer at a temperature of about 350 degrees centigrade to about 450 degrees centigrade for a time period of about 0.5 to about 3 minutes. The silicon nitride layer was then formed upon the pre-heated ammonia plasma treated patterned copper containing conductor layer while employing a plasma enhanced chemical vapor deposition (PECVD) method employing silane and ammonia as source materials. The plasma enhanced chemical vapor deposition (PECVD) method also employed: (1) a reactor chamber pressure of about 2 to about 20 torr; (2) a radio frequency power of about 200 to about 3000 watts per square centimeter substrate area; (3) a substrate temperature of about 350 degrees centigrade to about 450 degrees centigrade; (4) a silane flow rate of about 500 to about 3000 standard cubic centimeters per minute (sccm); and (5) an ammonia flow rate of about 500 to about 3000 standard cubic centimeters per minute (sccm). The silicon nitride layers were formed to a thickness of about 200 to about 800 angstroms.

The second deposition sequence was analogous to the first deposition sequence but employed: (1) a first thermal annealing of the patterned copper containing conductor layers at a temperature of about 350 degrees centigrade to about 450 degrees centigrade for a time period of about 0.5 to about 3 minute; followed by (2) an ammonia plasma treatment as described above, but at the pre-heated substrate temperature. The silicon nitride layer deposition conditions and thicknesses were otherwise identical to those provided above.

There was then measured for each of the microelectronic fabrications a hillock defect density within the silicon nitride passivation layers at the locations of the patterned copper containing conductor layers, as indicative of hillocks within the patterned copper containing conductor layers. The hillock densities are reported in Table I, as follows, as a function of fabrication variables.

TABLE I

| Pre-CMP An'l (Deg C.) | Post CMP An'l (Deg C.) | SiN Layer Dep Sequence | Hillock Density (Cts/cm2) |
|---|---|---|---|
| T1 = 150–250 | None | plasma –> anneal | 59000 +/– 10 |
|  | T3 = 150–250 | plasma –> anneal | 65000 +/– 10 |
| T1 = 150–250 | T4 = 250–350 | plasma –> anneal | 65000 +/– 10 |
| T2 = 250–350 | None | plasma –> anneal | 65000 +/– 10 |
| T1 = 250–350 | None | anneal –> plasma | 50 +/– 10 |
| T2 = 250–350 | None | anneal –> plasma | 50 +/– 10 |

As is seen from review of the data within Table I, a pre-heating annealing of a patterned copper containing conductor layer followed by a plasma treatment of the pre-heated patterned copper containing conductor layer provides for an attenuated hillock formation within the patterned copper containing conductor layer in comparison with a reverse ordering of the foregoing process steps.

As is understood by a person skilled in the art, the preferred embodiment of the present invention is illustrative of the present invention rather than limiting of the present invention. Revisions and modifications may be made to methods, materials, structures and dimensions through which is provided a microelectronic fabrication in accord with the preferred embodiment and examples of the present invention while still providing a method for fabricating a microelectronic fabrication in accord with the present invention, further in accord with the accompanying claims.

What is claimed is:

1. A method for fabricating a microelectronic fabrication comprising:

providing a substrate;

forming over the substrate a copper containing conductor layer; and forming upon the copper containing conductor layer a passivation layer by sequentially:

pre-heating the copper containing conductor layer to a temperature of from about 300 to about 450 degrees centigrade for a time period of from about 30 to about 120 seconds to form a pre-heated copper containing conductor layer;

plasma treating the pre-heated copper containing conductor layer within a reducing plasma to form a plasma treated pre-heated copper containing conductor layer; and forming upon the plasma treated pre-heated copper containing conductor layer a passivation layer.

2. The method of claim 1 wherein by pre-heating the copper containing conductor layer and plasma treating the pre-heated copper containing conductor layer, there is attenuated hillock defects within the plasma treated pre-heated copper containing conductor layer when forming the passivation layer thereupon.

3. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

4. The method of claim 1 wherein the reducing plasma is selected from the group consisting of hydrogen plasmas, ammonia plasmas and methane plasmas.

5. The method of claim 1 wherein the passivation layer is formed from a material selected from the group consisting of silicon oxide materials, silicon nitride materials, silicon carbide materials and derivatives thereof.

6. A method for fabricating a microelectronic fabrication comprising:

providing a substrate having formed therein an aperture;

forming within the aperture a patterned copper containing conductor layer; and forming upon the patterned copper containing conductor layer a passivation layer by sequentially:

pre-heating the patterned copper containing conductor layer to a temperature of from about 300 to about 450 degrees centigrade for a time period of from about 30 to about 120 seconds to form a pre-heated patterned copper containing conductor layer;

plasma treating the pre-heated copper containing conductor layer within a reducing plasma to form a plasma treated pre-heated copper containing conductor layer; and forming upon the plasma treated pre-heated copper containing conductor layer a passivation layer.

7. The method of claim 6 wherein by pre-heating the copper containing conductor layer and plasma treating the pre-heated copper containing conductor layer, there is attenuated hillock defects within the plasma treated pre-heated copper containing conductor layer when forming the passivation layer thereupon.

8. The method of claim 6 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

9. The method of claim 6 wherein the reducing plasma is selected from the group consisting of hydrogen plasmas, ammonia plasmas and methane plasmas.

10. The method of claim 6 wherein the passivation layer is formed from a material selected from the group consisting of silicon oxide materials, silicon nitride materials, silicon carbide materials and derivatives thereof.

11. A method for fabricating a microelectronic fabrication comprising:

providing a substrate having formed therein an aperture;

forming within the aperture a patterned copper containing conductor layer while employing a chemical mechanical polish planarizing method; and forming upon the patterned copper containing conductor layer a passivation layer by sequentially:

pre-heating the patterned copper containing conductor layer to a temperature of from about 300 to about 450 degrees centigrade for a time period of from about 30 to about 120 seconds to form a pre-heated patterned copper containing conductor layer;

plasma treating the pre-heated copper containing conductor layer within a reducing plasma to form a plasma treated pre-heated copper containing conductor layer; and forming upon the plasma treated pre-heated copper containing conductor layer a passivation layer.

12. The method of claim 11 wherein by pre-heating the copper containing conductor layer and plasma treating the pre-heated copper containing conductor layer, there is attenuated hillock defects within the plasma treated pre-heated copper containing conductor layer when forming the passivation layer thereupon.

13. The method of claim 11 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

14. The method of claim 11 wherein the reducing plasma is selected from the group consisting of hydrogen plasmas, ammonia plasmas and methane plasmas.

15. The method of claim 11 wherein the passivation layer is formed from a material selected from the group consisting of silicon oxide materials, silicon nitride materials, silicon carbide materials and derivatives thereof.

* * * * *